(12) United States Patent
Pan et al.

(10) Patent No.: US 10,211,046 B2
(45) Date of Patent: Feb. 19, 2019

(54) SUBSTRATE SUPPORT RING FOR MORE UNIFORM LAYER THICKNESS

(71) Applicant: APPLIED MATERIALS, INC., Santa Clara, CA (US)

(72) Inventors: Heng Pan, Santa Clara, CA (US); Lara Hawrylchak, San Jose, CA (US); Christopher S. Olsen, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 1178 days.

(21) Appl. No.: 14/315,794

(22) Filed: Jun. 26, 2014

(65) Prior Publication Data

US 2015/0020736 A1   Jan. 22, 2015

Related U.S. Application Data

(60) Provisional application No. 61/856,417, filed on Jul. 19, 2013.

(51) Int. Cl.
*H01L 21/02* (2006.01)
*H01L 21/67* (2006.01)
*H01L 21/687* (2006.01)

(52) U.S. Cl.
CPC .. *H01L 21/02274* (2013.01); *H01L 21/67248* (2013.01); *H01L 21/68735* (2013.01)

(58) Field of Classification Search
CPC ......... H01L 21/02274; H01L 21/68735; H01L 21/67248
See application file for complete search history.

(56) References Cited

U.S. PATENT DOCUMENTS

| 5,848,889 | A  | * | 12/1998 | Tietz .................. H01L 21/68735 392/418 |
| 6,888,104 | B1 | * | 5/2005  | Ranish ................ F27B 17/0025 118/50.1 |
| 8,202,621 | B2 |   | 6/2012  | Pickering et al. |
| 8,469,368 | B2 |   | 6/2013  | Kenworthy et al. |
| 2012/0213500 | A1 | | 8/2012  | Koelmel et al. |
| 2014/0105582 | A1 | | 4/2014  | Tallavarjula et al. |

FOREIGN PATENT DOCUMENTS

| JP | 2003-059852 | 2/2003 |
| JP | 2004-063895 | 2/2004 |

OTHER PUBLICATIONS

International Search Report and Written Opinion dated Oct. 27, 2014 for PCT Application PCT/US2014/045112.

* cited by examiner

*Primary Examiner* — Gordon Baldwin
*Assistant Examiner* — Mirza Israr Javed
(74) *Attorney, Agent, or Firm* — Moser Taboada; Alan Taboada

(57) ABSTRACT

Embodiments of substrate support rings providing more uniform thickness of layers deposited or grown on a substrate are provided herein. In some embodiments, a substrate support ring includes: an inner ring with a centrally located support surface to support a substrate; and an outer ring extending radially outward from the support surface, wherein the outer ring comprises a reaction surface area disposed above and generally parallel to a support plane of the support surface, and wherein the reaction surface extends beyond the support surface by about 24 mm to about 45 mm.

20 Claims, 4 Drawing Sheets

SUBSTRATE SUPPORT RING FOR MORE UNIFORM LAYER THICKNESS

CROSS-REFERENCE TO RELATED APPLICATIONS

This application claims benefit of U.S. provisional patent application Ser. No. 61/856,417, filed Jul. 19, 2013, which is herein incorporated by reference in its entirety.

FIELD

Embodiments of the present invention generally relate to semiconductor processing.

BACKGROUND

Substrates, such as semiconductor wafers, may be supported by a support apparatus, such as an edge ring, for processing within a process chamber. In some semiconductor fabrication processes, such as processes to deposit or grow an oxide layer, a combustion reaction is initiated in a process chamber to generate oxygen species to contribute to the growth of the oxide layer. However, the inventors have observed that in some processes, process non-uniformities can occur that affect the thickness uniformity of a layer on the wafer surface. In particular, varying deposition or growth rates at the substrate edge have been observed, leading to non-uniform layer formation at the edge of the substrate.

Accordingly, the inventors have provided embodiments of substrate supports that may facilitate improved process uniformity during some semiconductor fabrication processes.

SUMMARY

Embodiments of substrate support rings providing more uniform thickness of layers deposited or grown on a substrate are provided herein. In some embodiments, a substrate support ring includes: an inner ring comprising a centrally located support surface adapted to support a substrate; and an outer ring extending radially outward from the support surface, wherein the outer ring comprises a reaction surface area disposed above and generally parallel to a support plane of the support surface, and wherein the reaction surface extends beyond the support surface by about 24 mm to about 45 mm.

In some embodiments, a substrate support apparatus includes: an inner ring comprising a centrally located support surface to support a substrate; and an outer ring extending radially outward from the support surface, wherein the outer ring comprises a reaction surface area above and generally parallel to a support plane of the support surface, wherein the reaction surface extends beyond the support surface by about 24 mm to about 34 mm, and wherein the reaction surface is about 0.86 to about 0.97 mm above the support surface.

In some embodiments, a substrate processing apparatus includes a chamber body enclosing a processing volume; and a substrate support apparatus disposed and supported within the processing volume. The substrate processing apparatus includes an inner ring comprising a centrally located support surface adapted to support a substrate; and an outer ring extending radially outward from the substrate support surface wherein the outer ring comprises a reaction surface area above and generally parallel to a support plane of the support surface, the reaction surface extending beyond the support surface by about 24 mm to about 45 mm.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
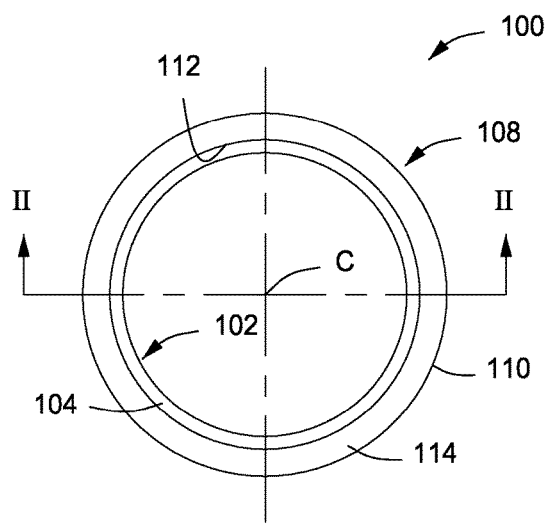
FIG. 1 depicts a top view of a substrate support ring in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present invention provide substrate support rings, or edge rings, for supporting a substrate, such as a semiconductor wafer, in a chamber for processing. The substrate support rings in accordance with embodiments of the present invention have been observed to beneficially affect process uniformity, particularly at the substrate edge. Embodiments of the disclosed support rings may beneficially affect layers deposited or grown on a substrate.

FIG. 1 depicts a top view of a substrate support ring, or edge ring 100, according to embodiments of the present invention. The illustrative edge ring 100 comprises an inner ring 102 having a support surface 104 centrally located about a center point C. The support surface 104 is configured to support a substrate having a given diameter (e.g., 200, 300, 450 mm semiconductor wafers, or the like) along an edge of the backside of the substrate. For example, the support surface 104 has an inner diameter that defines a central opening and an outer diameter defining a width of the support surface 104 between the inner and outer diameters.

The support surface 104 supports only an outer portion of the substrate, leaving the central and predominant portion of the backside of the substrate exposed. In some embodiments, the support surface 104 is configured to support the substrate along about 1.10 to about 1.56 percent of the diameter of the substrate. For example, for a 300 mm substrate, the support surface 104 may be about 3.3 to about 4.7 mm in width.

An outer ring 108 is disposed radially outward from the inner ring 102. The outer ring 108 comprises an outer edge 110, and inner edge 112, and a reaction surface 114 therebetween. The inner edge 112 forms a radially outward limit of the support surface 104 (i.e., the outer diameter of the support surface 104).

Figure 2:
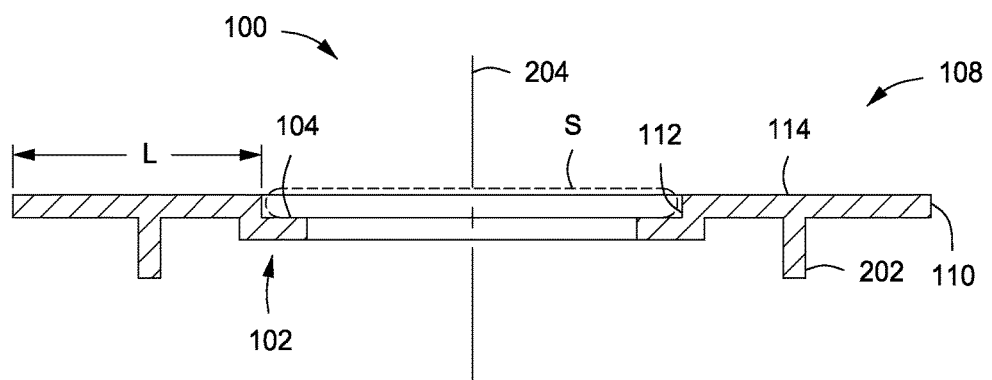
FIG. 2 depicts a cross sectional view of the substrate support ring of FIG. 1 taken along II-II.
Figure 3:
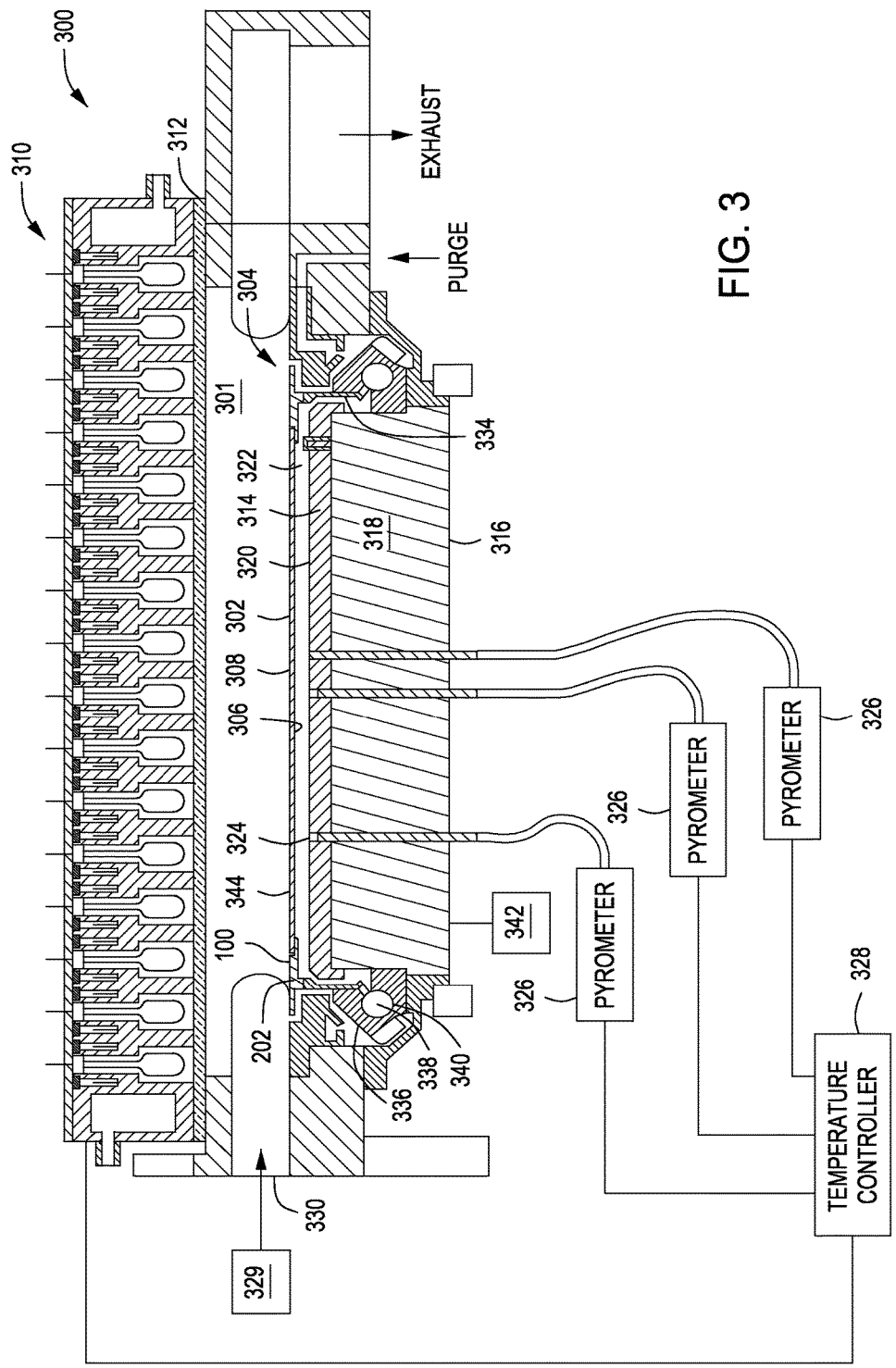
FIG. 3 depicts a schematic cross-sectional view of a process chamber including a substrate support ring in accordance with some embodiments of the present invention.

As illustrated in FIG. 2, the reaction surface 114 may be generally parallel to and disposed above the support surface 104 by the thickness of the substrate to be processed thereon such that the upper surface of the substrate is substantially even with the reaction surface 114. For example, in some embodiments, the reaction surface 114 is disposed above the support surface 104 between about 0.86 to about 0.97 mm, for example by about 0.91 mm. When a substrate is disposed on the support surface 104 for processing, the substrate surface S may be substantially planar with the reaction surface 114 in some embodiments. In other embodiments, the substrate surface S may be offset above or below the reaction surface 114. For example, in some embodiments the substrate surface S is above the reaction surface 114 by about 0.5 mm. In other embodiments, the substrate surface S may be below the reaction surface 114 by about 0.5 mm. Accordingly, when supported on the support surface 104 for processing, the substrate surface S may be between about 0.5 mm above and about 0.5 mm below the reaction surface 114. The reaction surface is substantially parallel to a support plane of the support surface 104 (i.e., the plane of the substrate when resting on the support surface 104). The edge ring 100 may comprise a projection 202 extending downwardly from a bottom surface of the outer ring 108. When disposed within a process chamber, the projection 202 may provide support for the ring within the chamber as discussed below with respect to FIG. 3.

The inner ring 102 and the outer ring 108 may comprise one or more process compatible materials, including non-limiting examples such as a ceramic material, for example, silicon carbide (SiC), and may be integrally formed or may be separately formed and coupled together. In some embodiments, portions of the inner ring 102 and the outer ring 108 may comprise a coating, for example a poly silicon coating. The inner ring 102 and the outer ring 108 may be concentric about axis 204 which passes through the center point C.

In the non-limiting embodiment illustrated in FIG. 2, the reaction surface 114 extends radially beyond the inner edge 112 a distance L. The distance L may be about 24 mm to about 45 mm, for example about 24 mm to about 34 mm. The inventors have observed that a beneficial effect may be obtained with a reaction surface 114 extending radially beyond the inner edge 112 by substantially any distance greater than about 24 mm for reasons to be discussed below. The inventors have also observed that edge rings with an L dimension greater than a certain amount, for example greater than about 34 mm, may provide suboptimal throughput, requires a larger chamber to house the edge ring, and requires additional time and energy to heat and cool.

The disclosed edge ring may be advantageously used in any process chamber configured to perform at least a rapid thermal processing process. Examples of process chambers suitable for performing the inventive method include any of the RADIANCE®, RADIANCE® PLUS, or VANTAGE® process chambers, or any other process chamber capable of performing a thermal process, for example a rapid thermal process (RTP), all available from Applied Materials, Inc., of Santa Clara, California. The disclosed edge ring may also be used in similar chambers from other manufacturers. In some embodiments, a suitable process chamber may be similar to the process chamber 300 described below with respect to FIG. 3.

The substrate 302, which may include one or more layers 344 disposed thereon (such as a dielectric layer), is mounted inside the process chamber 300 on a substrate support 304 and is heated by a radiant energy source, such as lamp head 310, which is disposed in a position opposing the substrate support 304. The lamp head 310 generates radiation which is directed to a front side 308 of the substrate 302. Alternatively, the lamp head 310 may be configured to heat the back side 306 of the substrate 302, for example, such as by being disposed beneath the substrate 302, or by directing the radiation to the back side 306 of the substrate 302. In the illustrative embodiment depicted in FIG. 3, the radiation enters the process chamber 300 through a water-cooled quartz window assembly 312. Beneath the substrate 302 is a reflector plate 314, which is mounted on a water-cooled, stainless steel base, for example base 316. The base 316 includes a circulation circuit 318 through which coolant circulates to cool the reflector plate 314. In some embodiments, the reflector plate 314 is made of aluminum and has a highly reflective surface coating 320. Water may be circulated through the base 316 to keep the temperature of the reflector plate 314 well below that of the heated substrate 302. Alternatively, other coolants may be provided at the same or different temperatures. For example, antifreeze (e.g., ethylene glycol, propylene glycol, or the like) or other heat transfer fluids may be circulated through the base 316 and/or the base 316 may be coupled to a chiller (not shown). An underside or backside of the substrate 302 and the top of the reflector plate 314 form a reflecting cavity 322. The reflecting cavity 322 enhances the effective emissivity of the substrate 302.

The temperatures at localized regions of the substrate 302 are measured by a plurality of temperature probes 324 coupled to a plurality of pyrometers 326. The plurality of pyrometers 326 is connected to a temperature controller 328 which controls the power supplied to the lamp head 310 in response to a measured temperature. The lamps may be divided into multiple zones. The zones can be individually adjusted by the controller to allow controlled radiative heating of different areas of the substrate 302.

During processing, a first gas may be flowed from a gas panel (e.g., gas supply 329) and enter the process chamber 300 at an inlet 330 (e.g., a first inlet) to at least partially fill a processing volume 301. For example, in some embodiments, the gas supply 329 may be a remote plasma source to form a plasma from the first gas prior to providing the plasma to the process chamber. The inlet 330 is disposed in a side of the process chamber 300 and facilitates the flow of the first gas across the surface of the substrate 302. The lamp head 310 provides sufficient energy to ignite a plasma from the first gas and maintain the plasma, or to maintain a plasma if the gas supply is a remote plasma source, in the process chamber 300 in the area above the substrate 302. The lamp head 310 ignites and/or maintains the plasma in a manner sufficient to maintain an oxidation reaction at least in the processing volume 301 above the substrate 302.

The substrate support 304 may be configured to be stationary or may be supported for rotation within the processing volume 301 to rotate the substrate 302. The substrate support 304 includes the edge ring 100 which contacts the substrate 302 around the outer perimeter of the substrate, thereby leaving the entire underside of the substrate 302 exposed except for a small annular region about the outer perimeter.

In some embodiments, the projections 202 of the edge ring 100 may rest on a rotatable tubular cylinder 334 that is coated with silicon to render it opaque in the frequency range of the pyrometer 326. The coating on the cylinder 334 acts as a baffle to block out radiation from the external sources that might contaminate the intensity measurements. The bottom of the cylinder 334 is held by an annular upper bearing 336 which rests on a plurality of ball bearings 338 that are, in turn, held within a stationary, annular, lower bearing race 340. In some embodiments, the ball bearings 338 are made of steel and coated with silicon nitride to reduce particulate formation during operations. The upper bearing 336 is coupled to an actuator (not shown) which rotates the cylinder 334, the edge ring 100 and the substrate 302 during processing.

The substrate support 304 may be coupled to a lift mechanism 342 capable of raising and lowering (i.e., provide vertical displacement) the substrate 302 with respect to the lamp head 310. For example, the substrate support 304 may be coupled to the lift mechanism 342, such that a distance between the substrate 302 and the reflector plate 314 is constant during the lifting motion.

Figure 4A:
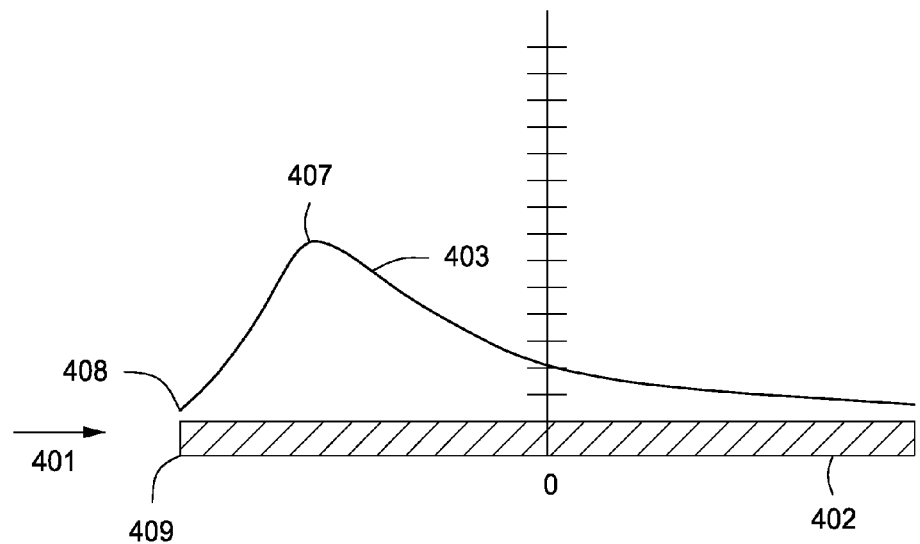
FIGS. 4A and 4B depict the observed thickness of a deposited or grown layer on a non-rotational wafer and a rotational wafer, respectively, processed under the same chamber conditions.
Figure 4B:
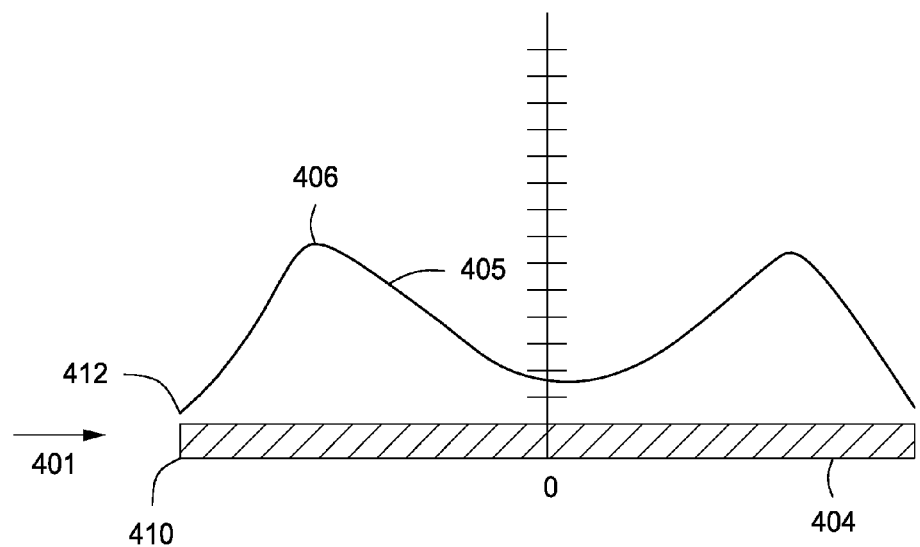

The inventors have observed that under some process conditions, for example rapid thermal processing (RTP) at temperatures between about 700° C. and about 900° C., a layer deposited or grown on a substrate exhibits a thickness non-uniformity at the edge of the substrate. The condition exists with substrates that are not rotated during processing yielding a non-rotational profile, as well as with substrates that are rotated during processing to produce a rotational profile. FIGS. 4A and 4B are illustrative of the observed thickness of a deposited or grown layer on a non-rotated substrate 402 and a rotated substrate 404 processed under the same chamber conditions using a conventional edge ring to support the substrate.

Each figure represents a substrate 402, 404 supported by a conventional edge ring (not shown) with a plot 403, 405, respectively, above and aligned with the wafer representing the average deposited or grown layer thickness along a diameter of the respective wafer. The 0 (zero) point represents the center of the substrate 402, 404, and the vertical axis may be any appropriate scale or unit of measurement for grown thickness, for example angstroms (Å). In both figures, the process gas flows across the substrate from left to right as illustrated by arrow 401.

As illustrated, the plot 403 of grown layer thickness of the non-rotated substrate 402 has a single peak 407, or a local maximum, towards the substrate edge 409 first contacted by the process gas flow. Between the maximum layer thickness represented by the peak 407 and the minimum grown thickness 408 near the substrate edge 409, the grown layer thickness decreases rapidly as indicated by the slope of the plot 403 between the peak 407 and the minimum grown thickness 408.

The plot 405 of the layer thickness of the rotated substrate 404 has a similar peak 406, or maximum, toward an edge 410 of the substrate. Between the maximum layer thickness represented by the peak 406 and the minimum grown thickness 412 near the substrate edge 410, the grown layer thickness on the rotated substrate decreases rapidly as indicated by the slope of the plot 405 between the peak 406 and the minimum grown thickness 412.

The inventors have observed that the grown layer thickness in non-rotational profiles is representative of the grown thickness of rotational profiles processed under the same chamber conditions. Although the grown thickness may not be identical in non-rotational and rotational profiles, the grown layer thickness on a rotational wafer exhibits a non-uniformity at the wafer edge that corresponds with the non-uniformity at the edge of a rotational wafer as illustrated in FIGS. 4A and 4B.

The change in the grown layer thickness between the local maximum and the outer edge of the grown layer is sometimes referred to as edge roll-off. The difference in layer thickness between a local maximum, for example the peak 406 or 407, and the minimum grown thickness 408 or 412, can be considered the magnitude of the edge roll-off. Because the edge roll-off effect is similar when a layer is grown on non-rotational and rotational wafers, the discussion of the edge roll-off applies to layers grown on both non-rotational and rotational wafers unless the context indicates otherwise.

For some applications, the edge roll-off as illustrated in FIGS. 4A and 4B is undesirable, and may be unacceptable in some applications. The inventors have observed that an edge ring 100 having an outer diameter within a specific range larger than the substrate diameter provides a practical mechanism for improving the uniformity of the grown layer on the substrate 302 under some process conditions.

Figure 5:
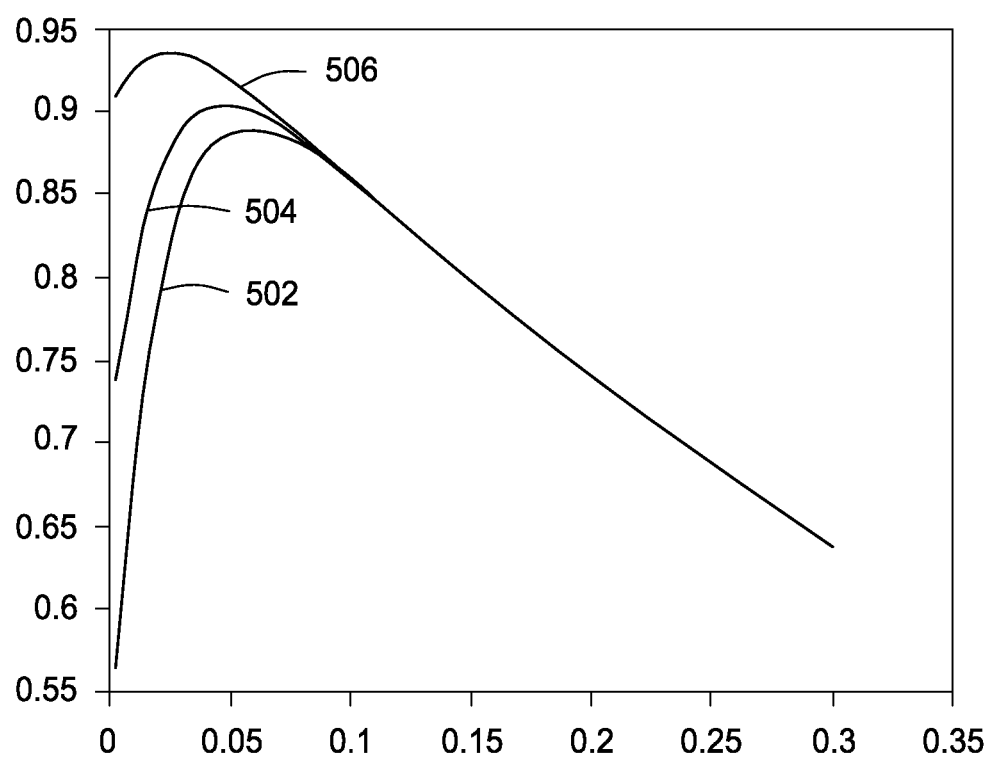
FIG. 5 depicts a plot of exemplary layer thickness deposited or grown on a substrate at different temperatures using a substrate support ring in accordance with embodiments of the present invention.

The graph 500 in FIG. 5 depicts exemplary layer thickness grown at different temperatures, while maintaining the other process parameters (e.g., pressure and process gas flow rates) essentially the same. The layer thicknesses represented in FIG. 5 may represent layers grown on a substrate. In the figure, curve 502 is illustrative of a layer thickness grown during a process at T1. Similarly, curves 504 and 506 are each illustrative of a layer thickness grown during a process at T2 and T3, respectively, where T1<T2<T3, for example, T1 may be 800° C., T2 may be 900° C., and T3 may be 1000° C. The origin of the horizontal axis represents the edge of the grown layer and corresponds with the outer edge of the effective combustion reaction taking place in the chamber above the substrate (for example, the outer edge 110 of the edge ring 100). The region within the outer edge of the effective combustion reaction region grows an acceptably uniform layer thickness, while areas outside the outer edge grow an insufficient layer thickness. The origin may also correspond with the edge of the wafer or the outer edge of the edge ring. The increasing horizontal scale represents a horizontal distance (in meters) in the direction of the process gas flow. The vertical axis may be any appropriate scale or unit of measurement for grown thickness, for example angstroms (Å).

The inventors observed that the magnitude of the edge roll-off decreases as the distance increases from the edge of the grown layer in the direction of process gas flow. For example, at a distance of about 0.05 m (50 mm) or greater, curves 502, 504, and 506 exhibit very little, if any, roll-off. As illustrated, at about 50 mm, curves 504 and 506 are in a generally upwardly sloped, linear portion of the respective curves. At 50 mm, curve 504 is at the approximate maximum (corresponding to 406 or 407 in FIGS. 4A and 4B). The inventors have observed that when the grown layer thickness is measured at a distance of about 10 mm to about 50 mm, for example from about 10 mm to 30 mm, from the edge of the grown layer, the magnitude of the roll-off is within an acceptable range for some processes.

The inventors discovered that it is advantageous to process a substrate such that the peripheral edge of the wafer is positioned at about 10 mm to about 50 mm, or at about 10 m to about 30 mm, with respect to the outer edge of the effective combustion reaction taking place in the chamber. For example, such processing may advantageously yield enhanced layer growth because of reduced edge roll-off occurring on the substrate. A substrate processed such that the peripheral edge of the substrate was positioned more than 0.05 m from the edge of the effective combustion reaction would exhibit similar desirable characteristics, but for reasons discussed below, such processing conditions may be suboptimal.

The inventors succeeded in advantageously manipulating the position of the outer edge of the effective combustion reaction region to be about 10 mm to about 50 mm, or about 10 mm to about 30 mm, beyond the substrate edge by providing an edge ring 100 with an outer diameter between about 24 mm and about 45 mm, for example between about 24 mm and 34 mm, larger than the diameter of the substrate 302.

As discussed above with reference to FIGS. 1 and 2, the edge ring 100 comprises an outer ring 108 having an outer edge 110 and inner edge 112 which forms an outer limit of the support surface 104. Between the inner edge 112 and the outer edge 110 is a reaction surface 114. The reaction surface 114 is an annular ring concentric with the support surface 104 and extending radially beyond the support surface 104 and a substrate 302 supported thereon by between about 24 mm and about 45 mm, or between about 24 mm and 34 mm. The reaction surface 114 of the edge ring 100 contributes to the enhanced performance of the edge ring.

The inventors have observed that edge rings 100 with reaction surfaces 114 which extend beyond the support surface 104 by more than about 45 mm increase production and operation costs. For example, a larger reaction surface requires additional material to fabricate, requiring a larger process chamber, and provides a greater area to support a combustion reaction, consuming additional process gases and energy. Although larger reaction surfaces may produce a reduced edge roll-off, the cost of achieving the reduction exceeds the benefit.

The inventors have also observed that edge rings 100 with reaction surfaces which extend beyond the support surface by less than about 24 mm do not adequately manipulate the outer edge of the effective combustion reaction region to reduce the edge roll-off an amount sufficient to yield the desired result.

While the foregoing is directed to embodiments of the present invention, other and further embodiments of the invention may be devised without departing from the basic scope thereof.

The invention claimed is:

1. A substrate support apparatus, comprising:
an inner ring comprising a centrally located support surface to support a substrate, wherein the support surface is configured to support the substrate along about 1.10 to about 1.56 percent of a diameter of the substrate; and
an outer ring extending radially outward from the support surface, wherein the outer ring comprises a reaction surface disposed above and generally parallel to a support plane of the support surface, and wherein the reaction surface extends beyond the support surface by about 24 mm to about 45 mm.

2. The substrate support apparatus of claim 1, wherein the inner ring and the outer ring are integrally formed.

3. The substrate support apparatus of claim 1, wherein the inner ring and the outer ring are separately formed.

4. The substrate support apparatus of claim 3, wherein the inner ring and the outer ring are coupled together.

5. The substrate support apparatus of claim 1, wherein at least one of the inner ring and the outer ring are formed from a ceramic material.

6. The substrate support apparatus of claim 5, wherein the ceramic material comprises silicon carbide.

7. The substrate support apparatus of claim 1, wherein the reaction surface is about 0.86 to about 0.97 mm above the support surface.

8. The substrate support apparatus of claim 1, wherein the support surface is configured to support a substrate having a diameter of about 300 mm.

9. A substrate support apparatus, comprising:
an inner ring comprising a centrally located support surface to support a substrate, wherein the support surface is configured to support the substrate along about 1.10 to about 1.56 percent of a diameter of the substrate; and
an outer ring extending radially outward from the support surface, wherein the outer ring comprises a reaction surface above and generally parallel to a support plane of the support surface, wherein the reaction surface extends beyond the support surface by about 24 mm to about 34 mm, and wherein the reaction surface is about 0.86 to about 0.97 mm above the support surface.

10. A substrate processing apparatus, comprising:
a chamber body enclosing a processing volume; and
a substrate support apparatus disposed and supported within the processing volume, the substrate support apparatus comprising:
an inner ring comprising a centrally located support surface adapted to support a substrate, wherein the support surface is configured to support the substrate along about 1.10 to about 1.56 percent of a diameter of the substrate; and
an outer ring extending radially outward from the support surface, wherein the outer ring comprises a reaction surface disposed above and generally parallel to a support plane of the support surface, and wherein the reaction surface extends beyond the support surface by about 24 mm to about 45 mm.

11. The substrate processing apparatus of claim 10, further comprising:
a gas supply to supply a process gas to the processing volume; and
a radiant energy source disposed above the substrate support apparatus, wherein the radiant energy source is sufficiently powerful to energize the process gas to form and sustain a plasma above the substrate support apparatus.

12. The substrate processing apparatus of claim 10, wherein the substrate support apparatus is supported for vertical displacement within the processing volume.

13. The substrate processing apparatus of claim 10, wherein the substrate support apparatus is supported for rotation within the processing volume.

14. The substrate processing apparatus of claim 10, wherein the inner ring and the outer ring are integrally formed.

15. The substrate processing apparatus of claim 10, wherein the inner ring and the outer ring are separately formed.

16. The substrate processing apparatus of claim 15, wherein the inner ring and the outer ring are coupled together.

17. The substrate processing apparatus of claim 10, wherein at least one of the inner ring and the outer ring are formed from a ceramic material.

18. The substrate processing apparatus of claim 17, wherein the ceramic material comprises silicon carbide.

19. The substrate processing apparatus of claim 10, wherein the support surface is configured to support a substrate having a diameter of about 300 mm.

20. The substrate processing apparatus of claim 10, wherein the reaction surface is about 0.86 to about 0.97 mm above the support surface.

* * * * *